(12) United States Patent
Mori et al.

(10) Patent No.: US 6,605,852 B2
(45) Date of Patent: Aug. 12, 2003

(54) SEMICONDUCTOR DEVICE AND METHOD FOR MANUFACTURING THE SAME INCLUDING FORMING A PLURALITY OF DUMMY CONVEX REGIONS ON A MATRIX WITH A VIRTUAL LINEAR LINE DEFINING AN ANGLE

(75) Inventors: Katsumi Mori, Sakata (JP); Kei Kawahara, Isahaya (JP); Yoshikazu Kasuya, Sakata (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 09/761,963

(22) Filed: Jan. 17, 2001

(65) Prior Publication Data
US 2001/0026992 A1 Oct. 4, 2001

(30) Foreign Application Priority Data
Jan. 18, 2000 (JP) ......................... 2000-009369

(51) Int. Cl.$^7$ ......................... H01L 31/00; H01L 29/00; H01L 29/06
(52) U.S. Cl. ......................... 257/459; 257/501; 257/534; 257/623
(58) Field of Search ................................. 438/404, 691, 438/692; 257/459, 501, 534, 623

(56) References Cited
U.S. PATENT DOCUMENTS
6,178,543 B1 * 1/2001 Chen et al. ................... 716/11

FOREIGN PATENT DOCUMENTS

| JP | 09/107028 | 4/1997 |
|---|---|---|
| JP | 10-092921 | 4/1998 |
| JP | 10-125681 | 5/1998 |
| JP | 11-026576 | 1/1999 |

OTHER PUBLICATIONS

Examination results from corresponding Japanese Application No. 2000–009369.

* cited by examiner

Primary Examiner—Olik Chaudhuri
Assistant Examiner—William M. Brewster
(74) Attorney, Agent, or Firm—Harness, Dickey & Pierce, P.L.C.

(57) ABSTRACT

A semiconductor device includes a silicon substrate 10 having a trench isolation region 24. A plurality of dummy convex regions 32 are formed in the trench isolation region 24. The trench isolation region 24 defines a row direction and a column direction. Also, the trench isolation region 24 define first virtual linear lines L1 that extend in a direction traversing the row direction and second virtual linear lines L2 that extend in a direction traversing the column direction. The first virtual linear lines L1 and the row direction define an angle of 2–40 degree, and the second virtual linear lines L2 and the column direction define an angle of 2–40 degree. The dummy convex regions 32 are disposed on the first virtual linear lines L1 and the second virtual linear lines L2.

45 Claims, 12 Drawing Sheets

Fig. 11 (a) (Prior Art)
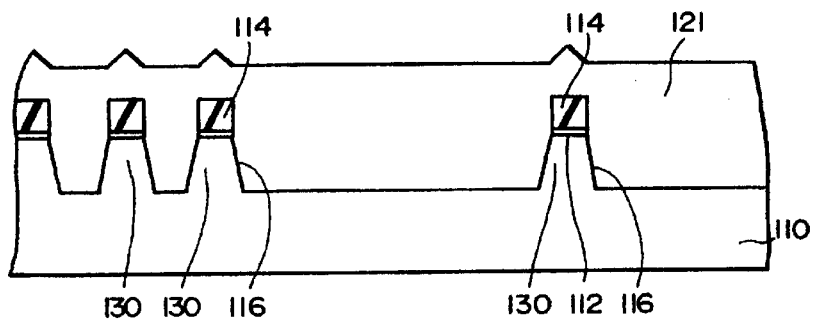
Fig. 11 (b) (Prior Art)
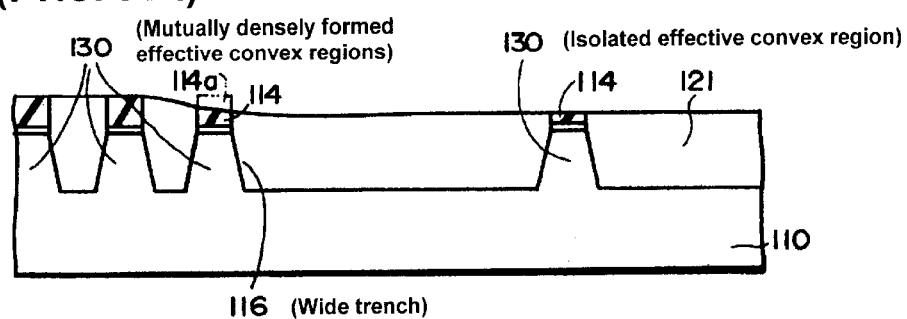
Fig. 11 (c) (Prior Art)
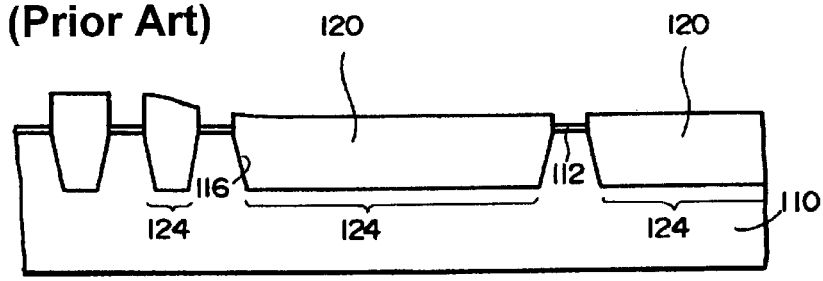

(Dummy convex regions)

SEMICONDUCTOR DEVICE AND METHOD FOR MANUFACTURING THE SAME INCLUDING FORMING A PLURALITY OF DUMMY CONVEX REGIONS ON A MATRIX WITH A VIRTUAL LINEAR LINE DEFINING AN ANGLE

TECHNICAL FIELD

The present invention relates to a semiconductor device and a method for manufacturing the same, and more particularly to a semiconductor device having an element isolation region and a method for manufacturing the same.

BACKGROUND

With the miniaturization of semiconductor devices (for example, MOS transistors) promoted in recent years, a further miniaturization of element isolation regions in semiconductor devices is required. In order to achieve a further miniaturization of element isolation regions in semiconductor devices, a trench isolation technique has been introduced. In the trench isolation technique, trenches are provided between semiconductor elements over a semiconductor substrate, and a dielectric material is filled in the trenches to isolate the semiconductor elements from one another. One example of the element isolation technique is described below.

FIG. 11 shows a silicon substrate 110 having trenches 116, and a dielectric layer 121 formed over the silicon substrate 110. A polishing stopper layer 114 is formed over effective convex regions 130 in the silicon substrate 110. A pad layer 112 is interposed between the effective convex regions 130 and the polishing stopper layer 114.

As shown in FIG. 11(b), the dielectric layer 121 is planarized using the polishing stopper layer 114 as a stopper. The planarization of the dielectric layer 121 is performed by a chemical-mechanical polishing method (hereinafter referred to as a "CMP method").

Then, as shown in FIG. 11(c), the polishing stopper layer 114 is removed to thereby form trench dielectric layers 120, whereby trench isolation regions 124 are completed.

However, as shown in FIG. 11(b), a certain device design may require that plural effective convex regions 130 be closely formed in one area and an isolated effective convex region 130 is formed separated from such area. In this case, the following problems occur.

When the dielectric layer 121 is planarized by the CMP method, the polishing stopper layer 114 at the isolated effective convex region 130 may be excessively cut. On the other hand, the polishing stopper layer 114 over the mutually densely formed effective convex regions 130 may not be cut enough as compared to the polishing stopper layer 114 at the isolated effective convex region 130. This phenomenon occurs because the polishing rate differs depending on pattern densities of the effective convex regions 130. In other words, the polishing pressure is concentrated over the polishing stopper layer 114 at the isolated effective convex region 130. As a result, the polishing rate at the isolated effective convex region 130 becomes greater than the polishing rate at the mutually densely formed effective convex regions 130. Consequently, the polishing stopper layer 114 at the isolated effective convex region 130 is excessively polished.

When the polishing stopper layer 114 at the isolated effective convex region 130 is excessively polished, the thickness of the resultant trench dielectric layers 120 become irregular, as shown in FIG. 11(c). Also, the polishing stopper layer 114 cannot properly perform its function. Moreover, as the isolated effective convex region 130 is excessively polished, the polishing cloth warps, and erosion occurs in the polishing stopper layer 114 in the area where the effective convex regions 130 are mutually densely formed. The erosion is a phenomenon in which a corner section 114a of the polishing stopper layer 114 is cut. Also, when the polishing cloth warps, dishing occurs in an upper portion of the dielectric layer 121. The dishing is a phenomenon in which an upper portion of the dielectric layer 121 is formed in a dish shape.

In order to solve the problems described above, one technique, in which dummy convex regions 132 are formed in the trench 116, as shown in FIG. 12, is proposed. By the provision of the dummy convex regions 132, the polishing pressure is distributed over the dummy convex regions 132. Accordingly, the concentration of the polishing pressure over the isolated effective convex region 130 is prevented, and the polishing rate at the isolated effective convex region does not become excessively greater. Consequently, the provision of the dummy convex regions 132 prevents the isolated effective convex region 130 from being excessively cut.

The technique for forming the dummy convex regions 132 is described in Japanese laid-open patent application H9-107028, Japanese laid-open patent application H9-181159, Japanese laid-open patent application H10-92921, Japanese laid-open patent application H11-26576, U.S. Pat. No. 5,885,856 and U.S. Pat. No. 5,902,752.

SUMMARY (A) In accordance with a first embodiment of the present invention, a semiconductor device has a trench isolation region defining a row direction and first virtual linear lines extending in a direction traversing the row direction, wherein the row direction and each of the first virtual linear lines define an angle of about 2 to 40 degree. A plurality of dummy convex regions are provided in the trench isolation region, wherein the dummy convex regions are disposed on the first virtual linear lines.

The "row direction" used here refers to one direction that is virtually defined in view of an active region, a gate region, a boundary region between an n-well and a p-well and a prohibited region.

In the semiconductor device in accordance with the first embodiment, the dummy convex regions are disposed on the first virtual linear lines. In a preferred embodiment, the row direction and the first virtual linear lines define an angle of 2 to 40 degree. In other words, adjacent ones of the dummy convex regions formed on the first virtual linear lines and disposed in the row direction are mutually off set in a column direction. As a result, dummy convex regions that are mutually densely arranged can also be readily formed in an area adjacent to a prohibited area that extends in the row direction. In other words, when some of the dummy convex regions overlap the prohibited area, the other dummy convex regions are securely disposed in an area adjacent to the prohibited area. As a consequence, when the dielectric layer filled in the trench is polished, the polishing pressure is securely distributed over the dummy convex regions adjacent to the prohibited area.

Also, because the dummy convex regions are securely disposed in an area adjacent to the prohibited area, the dummy convex regions can also be securely provided in a region where a gap between adjacent dummy convex regions is narrow, in other words, where the adjacent dummy convex regions are spaced a short distance from one another.

(B) In accordance with a second embodiment of the present invention, a semiconductor device comprises a trench isolation region defining a column direction and second virtual linear lines extending in a direction traversing the column direction, wherein the column direction and each of the second virtual linear lines define an angle of 2 to 40 degree. A plurality of dummy convex regions are provided in the trench isolation region, wherein the dummy convex regions are disposed on the second virtual linear lines.

The "column direction" used here refers to one direction that is virtually defined in view of an active region, a gate region, a boundary region between an n-well and a p-well and a prohibited region.

In the semiconductor device in accordance with the second embodiment, the dummy convex regions are disposed on the second virtual linear lines. The column direction and the second virtual linear lines define an angle of about 2 to 40 degree. In other words, adjacent ones of the dummy convex regions formed on each of the second virtual linear lines and disposed in the column direction are mutually off set in the row direction. As a result, dummy convex regions that are mutually densely arranged can also be readily formed in an area adjacent to a prohibited area that extends in the column direction. In other words, when some of the dummy convex regions overlap the prohibited area, the other dummy convex regions are securely disposed in an area adjacent to the prohibited area. As a consequence, when the dielectric layer filled in the trench is polished, the polishing pressure is securely distributed over the dummy convex regions adjacent to the prohibited area.

Also, because the dummy convex regions are securely disposed in an area adjacent to the prohibited area, the dummy convex regions can also be securely disposed in a region where separations between the dummy convex regions are narrow, in other words, where the adjacent dummy convex regions are spaced a short distance from one another.

(C) In accordance with a third embodiment of the present invention, a semiconductor device comprises a trench isolation region defining a row direction and a column direction and a plurality of dummy convex regions in the trench isolation region disposed in the row direction and the column direction, wherein each of the dummy convex regions has a generally square shape in plan view. The dummy convex regions that are disposed in the row direction are spaced a first distance from one another, wherein the first distance is about a half of an edge of each of the dummy convex regions. Also, the dummy convex regions that are disposed in the row direction are off set by a second distance from one another in the column direction, wherein the second distance is about a half of an edge of each of the dummy convex regions.

The "row direction" and the "column direction" may be defined in a similar manner as the first and second embodiments.

In accordance with the third embodiment, the dummy convex regions that are disposed in the row direction are off set by a second distance from one another in the column direction. Accordingly, the semiconductor device of the third embodiment can provide the same effects as those provided by the semiconductor device of the first embodiment.

(D) In accordance with a fourth embodiment of the present invention, a semiconductor device comprises: a trench isolation region defining a row direction and a column direction; and a plurality of dummy convex regions in the trench isolation region arranged in row direction and the column direction, wherein each of the dummy convex regions has a generally square shape in plan view. The dummy convex regions that are disposed in the column direction are spaced a first distance from one another, wherein the first distance is about a half of an edge of each of the dummy convex regions. The dummy convex regions that are disposed in the column direction are off set by a second distance from one another in the row direction, wherein the second distance being about a half of an edge of each of the dummy convex regions.

The "row direction" and the "column direction" may be defined in a similar manner as the first and second embodiments.

In accordance with the fourth embodiment, the dummy convex regions that are disposed in the column direction are off set by a second distance from one another in the row direction. Accordingly, the semiconductor device of the fourth embodiment can provide the same effects as those provided by the semiconductor device of the second embodiment.

(E) In accordance with a fifth embodiment of the present invention, a method is provided for manufacturing a semiconductor device having a trench isolation region. For example, the semiconductor device may be manufactured as follows. A polishing stopper layer having a specified pattern is formed over a semiconductor substrate. A trench is formed in the semiconductor substrate using at least the polishing stopper layer as a mask. A dielectric layer is formed over the semiconductor substrate in a manner to fill the trench with the dielectric layer. The dielectric layer is polished using the polishing stopper layer as a stopper. A row direction and first virtual linear lines extending in a direction traversing the row direction are defined for the trench in a manner that the row direction and the first virtual linear lines define an angle of about 2–40 degree. When the trench is formed, a plurality of dummy convex regions are also formed in the trench in a manner that the dummy convex regions are disposed on the first virtual linear lines.

By the method in accordance with the fifth embodiment, the dummy convex regions are formed to have the same pattern as that of the semiconductor device of the first embodiment described above. Accordingly, the dummy convex regions can also be securely formed in an area adjacent to a prohibited area. As a consequence, when the dielectric layer filled in the trench is polished, the polishing pressure is securely, evenly distributed over the dummy convex regions. Consequently, the thickness of the dielectric layer obtained by the polishing step is more uniform.

(F) In accordance with a sixth embodiment of the present invention, a method is provided for manufacturing a semiconductor device having a trench isolation region. For example, the semiconductor device may be manufactured as follows. A polishing stopper layer having a specified pattern is formed over a semiconductor substrate. A trench is formed in the semiconductor substrate using at least the polishing stopper layer as a mask. A dielectric layer is formed over the semiconductor substrate in a manner to fill the trench with the dielectric layer. The dielectric layer is polished using the polishing stopper layer as a stopper. A column direction and second virtual linear lines extending in a direction traversing the column direction are defined for the trench in a manner that the column direction and the second virtual linear lines define an angle of about 2–40 degree. A plurality of dummy convex regions are formed in the trench in a manner that the dummy convex regions are disposed on the second virtual linear lines.

By the method in accordance with the sixth embodiment, the dummy convex regions are formed to have the same pattern as that of the semiconductor device of the second embodiment described above. As a consequence, the method of the sixth embodiment provides effects similar to those provided by the method of the fifth embodiment.

(G) In accordance with a seventh embodiment of the present invention, a method is provided for manufacturing a semiconductor device having a trench isolation region. For example, the semiconductor device may be manufactured as follows. A polishing stopper layer having a specified pattern is formed over a semiconductor substrate. A trench is formed in the semiconductor substrate using at least the polishing stopper layer as a mask. A dielectric layer is formed over the semiconductor substrate in a manner to fill the trench with the dielectric layer. The dielectric layer is polished using the polishing stopper layer as a stopper. A row direction and a column direction are defined for the trench. When the trench is formed, a plurality of dummy convex regions each having a generally square shape in plan view are formed in the trench. In one aspect, the dummy convex regions that are arranged next to one other in the row direction are spaced a first distance from one another, the first distance being about a half of an edge of each of the dummy convex regions. Also, the dummy convex regions that are arranged next to one another in the row direction are off set by a second distance from one another in the column direction, the second distance being about a half of an edge of each of the dummy convex regions.

By the method in accordance with the seventh embodiment, the dummy convex regions are formed to have the same pattern as that of the semiconductor device of the third embodiment described above. As a consequence, the method of the seventh embodiment provides effects similar to those provided by the method of the fifth embodiment.

(H) In accordance with a eighth embodiment of the present invention, a method is provided for manufacturing a semiconductor device having a trench isolation region. For example, the semiconductor device may be manufactured as follows. A polishing stopper layer having a specified pattern is formed over a semiconductor substrate. A trench is formed in the semiconductor substrate using at least the polishing stopper layer as a mask. A dielectric layer is formed over the semiconductor substrate in a manner to fill the trench with the dielectric layer. The dielectric layer is polished using the polishing stopper layer as a stopper. A row direction and a column direction are defined for the trench. When the trench is formed, a plurality of dummy convex regions each having a generally square shape in plan view are formed in the trench. In one aspect, the dummy convex regions that are arranged next to one another in the column direction are spaced a first distance from one another, the first distance being about a half of an edge of each of the dummy convex regions. Also, the dummy convex regions that are arranged next to one another in the column direction are off set by a second distance from one another in the row direction, the second distance being about a half of an edge of each of the dummy convex regions.

By the method for manufacturing a semiconductor device in accordance with the eighth embodiment, the dummy convex regions are formed to have the same pattern as that of the semiconductor device of the fourth embodiment described above. As a consequence, the method of the eighth embodiment provides effects similar to those provided by the method of the fifth embodiment.

BRIEF DESCRIPTION OF THE DRAWINGS

FIGS. 11(a)–11(c) schematically show cross-sectional views of a trench isolation region in a conventional manufacturing process.

DETAILED DESCRIPTION

Preferred embodiments of the present invention will be described below with reference to the accompanying drawings.

[Semiconductor Device]
(Device Structure)

Figure 1:
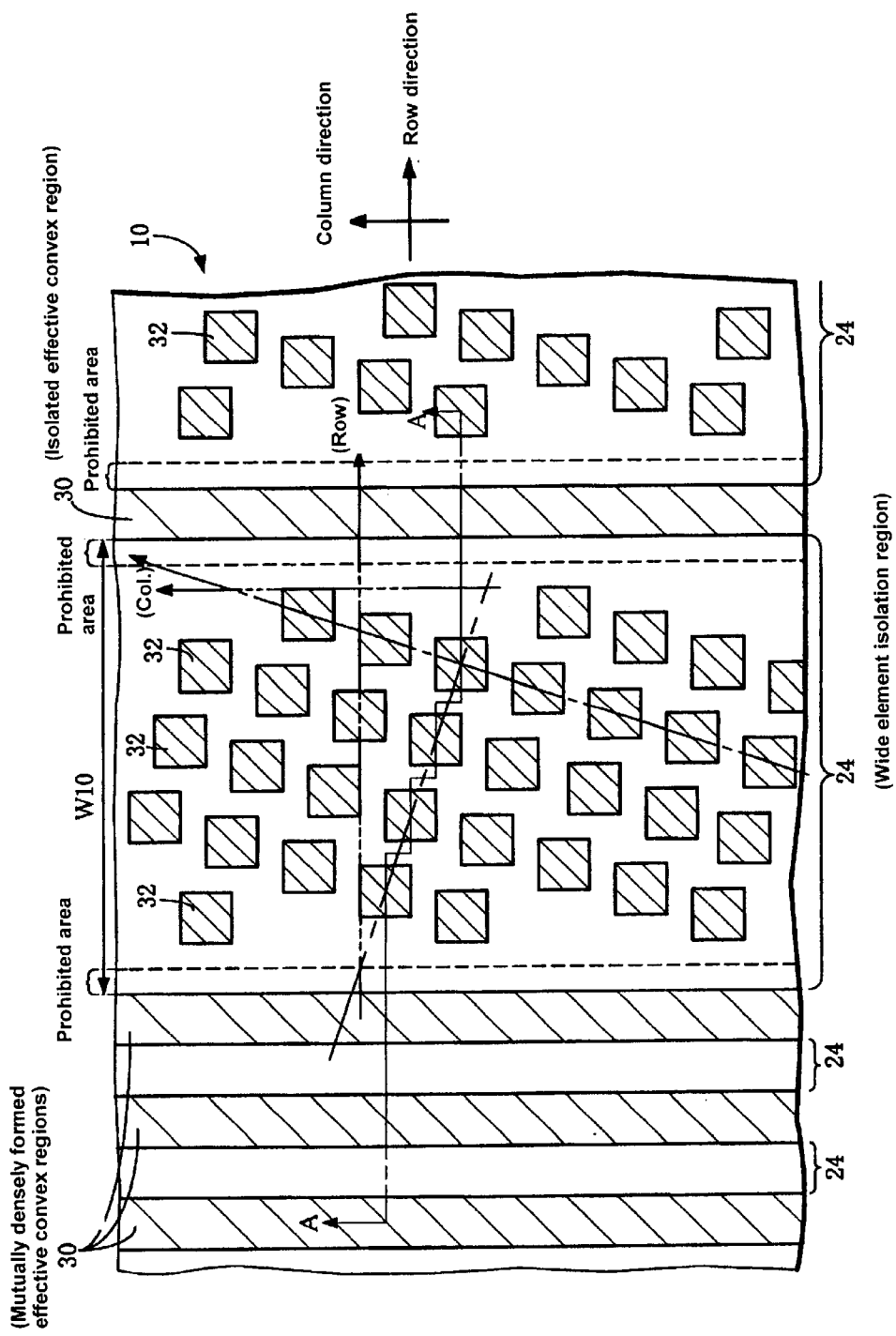
FIG. 1 shows a plan view of a silicon substrate having a trench isolation region.
Figure 2:
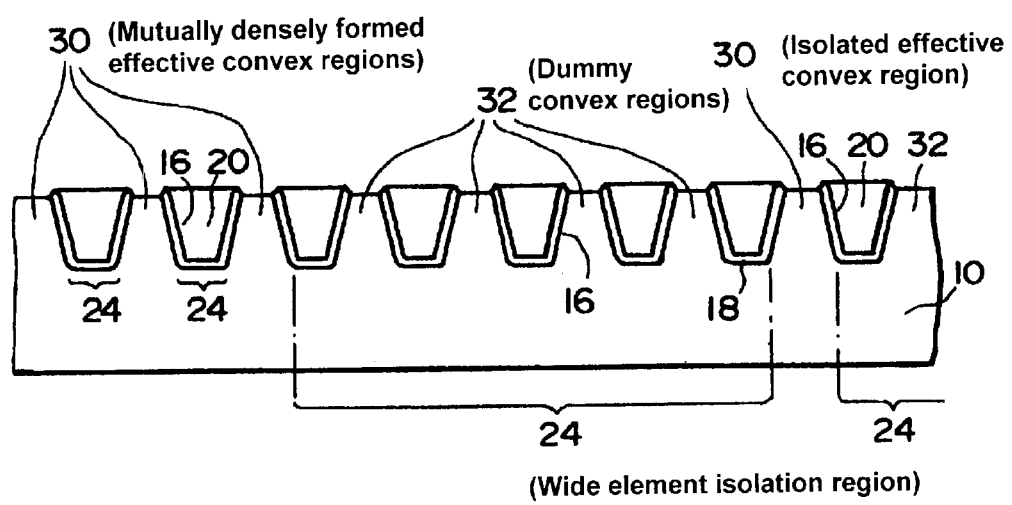
FIG. 2 schematically shows a cross-sectional view taken along a line A—A of FIG. 1.

A semiconductor device in accordance with one embodiment of the present invention is described below. The semiconductor device of the present embodiment has a silicon substrate and a trench isolation region formed in the silicon substrate. In one aspect of the present embodiment, a silicon substrate having a trench isolation region is formed with a novel structure. FIG. 1 shows a plan view of the silicon substrate having the trench isolation region. FIG. 2 generally illustrates a cross-sectional view taken along a line A—A of FIG. 1.

Effective convex regions 30 having a specified pattern are formed in the silicon substrate 10. The effective convex regions 30 become to be, for example, element forming regions for MOS transistors or the like. The effective convex regions 30 are disposed regularly or randomly. Depending on the device design requirements, some of the effective convex regions 30 may be densely formed in an area, but some of the effective regions 30 may be isolated and spaced a distance from the area where the effective convex regions 30 are densely formed. Referring to FIG. 1, a plurality of the effective convex regions 30 are densely formed in one area on the left hand side of the silicon substrate 10, and one effective convex region 30 is isolated from the area on the left hand side. The effective convex regions 30 that are densely formed are separated from the isolated effective convex region 30 by a relatively wide element isolation region 24.

Dummy convex regions 32 are formed in the trench isolation region 24. The dummy convex regions 32 are regularly disposed in a direction traversing a first matrix direction (for example, a direction of rows or a direction of columns in a matrix) and also regularly disposed in a direction traversing a second matrix direction (for example, a direction of rows or a direction of columns in the matrix). The second matrix direction may preferably be perpendicular to the first matrix direction. In one embodiment, as shown in FIG. 1, the dummy convex regions 32 are regularly disposed in a direction traversing a direction of rows (hereafter referred to as row direction). Also, the dummy convex regions 32 are regularly disposed in a direction traversing a direction of columns (hereafter referred to as column direction). The trench isolation region 24 has a width (i.e., a separation between the densely formed effective convex regions and the isolated effective convex region) W10. The width W10 is not limited to a specific range.

Prohibited areas (to be described below) are defined around the effective convex regions 30. The "prohibited area" refers to a region where any of the dummy convex regions 32 are not created. In other word, the dummy convex regions 32 are formed in a manner to avoid overlapping with the prohibited area. In one embodiment, the dummy convex regions that may entirely or partially overlap the prohibited area are not formed at all. Advantages derived from completely excluding the dummy convex regions that may partially overlap the prohibited area are described below.

Figure 3:
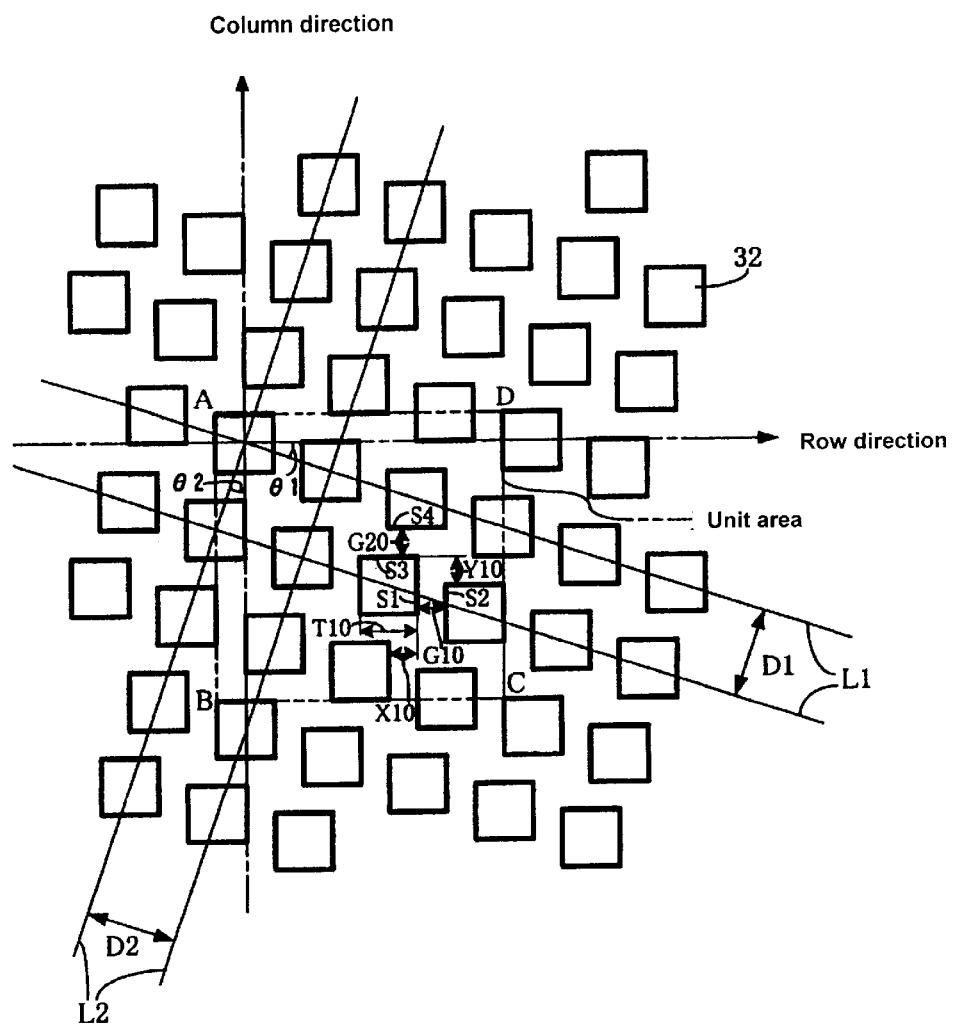
FIG. 3 shows a pattern of dummy convex regions.

Pattern placement for the dummy convex regions 32 is described with reference to FIG. 3.

The dummy convex regions 32 are formed in a manner that the dummy convex regions 32 are located on first virtual linear lines L1. Also, the dummy convex regions 32 are formed in a manner to be located on second virtual linear lines L2. The dummy convex regions 32 are formed in a manner that centers of the dummy convex regions 32 are located on the first virtual linear lines L1. Also, the dummy convex regions 32 are formed in a manner that the centers of the dummy convex regions 32 are located on the second virtual linear lines L2.

The first virtual linear lines L1 traverse the row direction. The first virtual linear lines L1 and the row direction define an angle θ1 that is about 2–40 degree. Preferably, the angle θ1 is about 15–25 degree. More preferably, the angle θ1 is about 20 degree. The "row direction" used here refers to one direction that is virtually defined in view of an active region, a gate region, a boundary region between an n-well and a p-well and a prohibited region. For example, the row direction may extend in a direction perpendicular to or in parallel with a strip of a prohibited area.

The second virtual linear lines L2 traverse the column direction. The second virtual linear lines L2 and the column direction define an angle θ2 that is about 2–40 degree. Preferably, the angle θ2 is about 15–25 degree. More preferably, the angle θ2 is about 20 degree. The "column direction" used here refers to one direction that is virtually defined in view of an active region, a gate region, a boundary region between an n-well and a p-well and a prohibited region. For example, the column direction may extend in a direction perpendicular to or in parallel with a strip of a prohibited area.

In one embodiment, a plurality of first virtual linear lines L1 are defined. The first virtual linear lines L1 are separated from one another at a specified pitch. The first virtual linear lines L1 may be separated from one another by any distance. However, in a preferred embodiment, adjacent ones of the first virtual linear lines L1 may be separated from one another by a gap of, for example, about 1–16 μm, and more preferably about 2–5 μm. In one embodiment, a plurality of second virtual linear lines L2 are defined. The second virtual linear lines L2 are separated from one another at a specified pitch. The second virtual linear lines L2 may be separated from one another by any distance. However, in a preferred embodiment, adjacent ones of the second virtual linear lines L2 may be separated from one another by a gap of, for example, about 1–16 μm, and more preferably about 2–5 μm.

Adjacent ones of the dummy convex regions 32 disposed on each one of the first virtual linear lines L1 are mutually off set in the column direction. The dummy convex regions 32 may be off set in the column direction by a width Y10. In one embodiment, the width Y10 is about 0.5–5 μm. In a preferred embodiment, the width Y10 is 0.5–2 μm, and more preferably about 1 μm.

Adjacent ones of the dummy convex regions 32 disposed on each one of the second virtual linear lines L2 are mutually off set in the row direction. The dummy convex regions 32 may be off set in the row direction by a width X10. In one embodiment, the width X10 is about 0.5–5 μm. In a preferred embodiment, the width X10 is 0.5–2 μm, and more preferably about 1 μm.

As a top surface of the silicon substrate 10 including the trench isolation region 24 is viewed from above, a ratio of an area occupied by the dummy convex regions 32 with respect to a unit area of the trench isolation region 24 is not particularly limited. However, in a preferred embodiment, the area occupied by the dummy convex regions 32 is about 30–50%, and more preferably about 40%, of a unit area of the trench isolation region 24. In one embodiment, the area occupied by the dummy convex regions 32 may preferably be about 30–50%, and more preferably about 40%, of the entire area of the trench isolation region 24.

The "unit area" used here is the minimum unit area that can be repeated in an up-to-down direction and right-to-left direction to form the entire pattern. In one embodiment, a unit area is a rectangular area defined by points A, B, C and D shown in FIG. 3.

The configuration in plan view of the dummy convex region 32 is not particularly limited. For example, the dummy convex region 32 may have a polygonal shape in plan view or a circular shape in plan view. In a preferred embodiment, the dummy convex region 32 may have a rectangular shape in plan view, and more preferably a square shape in plan view. When the dummy convex regions 32 each have a generally square shape in plan view, the dummy convex regions 32 can be more densely formed in the trench isolation region 24. For example, the dummy convex regions 32 can be more securely formed even in an area adjacent to a crossing area where prohibited areas cross each other at angle. As a result, the dummy convex regions 32 can be more effectively formed in an area adjacent to a prohibited area formed with a complex pattern (for example, a prohibited area around a gate region that is formed with a complex pattern).

When the configuration in plan view of the dummy convex region 32 is generally square, the length T10 of each edge of the dummy convex region 32 is not particularly limited. However, for example, the length of each edge of the dummy convex region 32 may be about 1–10 µm. Preferably, the length of each edge of the dummy convex region 32 may be about 1–5 µm, and more preferably about 2 µm. When the length T10 of each edge of each of the dummy convex regions 32 is about 1 µm or greater, the amount of data for generating masks, which are used to form the dummy convex regions 32, does not substantially increase. When the length T10 of each edge of each of the dummy convex regions 32 is about 5 µm or shorter, a dielectric layer deposited over the dummy convex regions 32 can have generally the same thickness of a dielectric layer that is deposited over the effective convex regions (for example, a circuit region) 30, when the dielectric layer is embedded in the trench (to be described below). Accordingly, when a dielectric layer 21 is polished in a later step (to be described below), the dummy convex regions 32 each having the edge length T10 of about 5 µm or shorter more securely prevent the dielectric layer 21 from remaining over the dummy convex regions 32. Also, the dummy convex regions 32 each having the edge length T10 of about 5 µm or shorter is particularly useful when the dielectric layer 21 is embedded in the trench 16 using a high-density plasma CVD.

When the configuration in plan view of the dummy convex region 32 is generally square, adjacent ones of the dummy convex regions 32 disposed on the same one of the first virtual linear lines L1 have edges S1 and S2 that partially oppose to one another. A gap G10 between the partially opposing edges S1 and S2 is not particularly limited to a specific range. However, the gap G10 may preferably be about 0.5–5 µm, and more preferably about 1 µm. Also, the gap G10 may preferably be shorter than the edge length T10 of each of the dummy convex regions 32. More preferably, the gap G10 may be about a half of the edge length T10 of each the dummy convex regions 32.

When the configuration in plan view of the dummy convex region 32 is generally square, adjacent ones of the dummy convex regions 32 disposed on the same one of the second virtual linear lines L2 have edges S3 and S4 that partially oppose to one another. A gap G20 between the partially opposing edges S1 and S2 is not particularly limited to a specific range. However, the gap G20 may preferably be 0.5–5 µm, and more preferably about 1 µm. Also, the gap G20 may preferably be shorter than the edge length T10 of each of the dummy convex regions 32. More preferably, the gap G20 may be about a half of the edge length T10 of each the dummy convex regions 32.

When the configuration in plan view of the dummy convex region 32 is generally square, adjacent ones of the dummy convex regions 32 in the row direction are off set by the width Y10 in the column direction. The width Y10 may preferably be about a half of the length of each edge of the dummy convex region 32. Also, adjacent ones of the dummy convex regions 32 in the column direction are off set by the width X10 in the row direction. The width X10 may preferably be about a half of the length of each edge of the dummy convex region 32.

Figure 4:
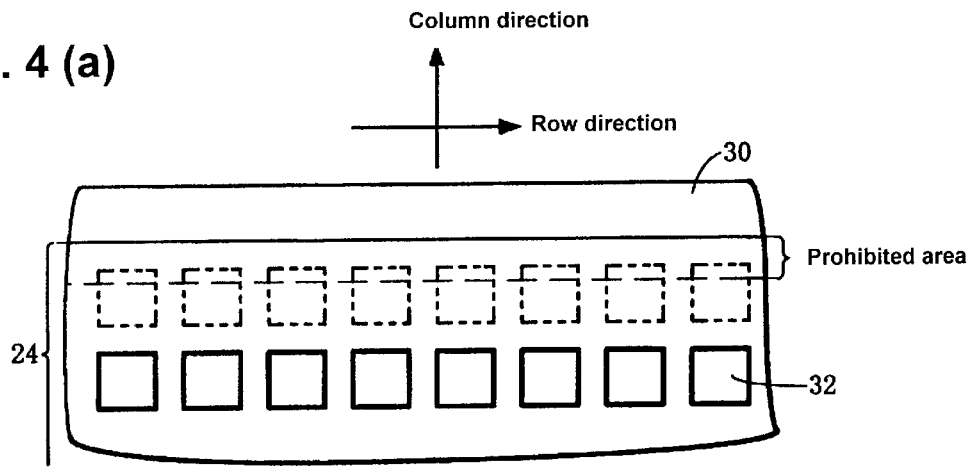
FIGS. 4(a) and 4(b) schematically show plan views of patterns of dummy convex regions formed adjacent to prohibited areas.
Figure 4:
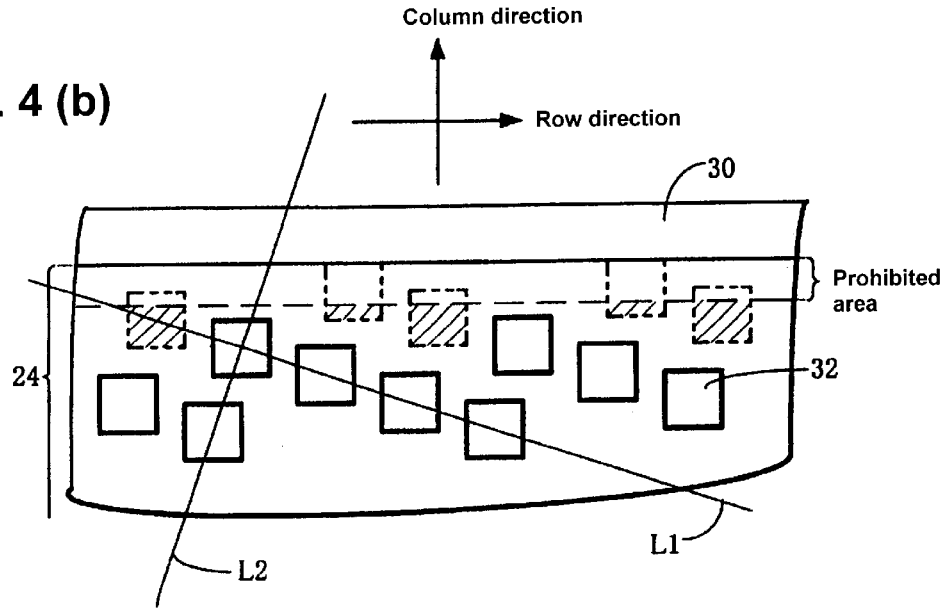

The dummy convex regions 32 having the configurations described above provide at least the following effects. The effects obtained by the above-described configurations of the dummy convex regions 32 will be described below with reference to FIG. 4.

(1) For example, let us assume that a prohibited area extends in the row direction around effective convex regions in a trench isolation region, as shown in FIG. 4(a). Dummy convex regions in a lattice structure may be formed along the prohibited area. When the dummy convex regions are formed in a lattice structure in parallel with the prohibited area, and if any one of the dummy convex regions in one of the rows of the lattice overlaps the prohibited area, the other dummy convex regions in the same row overlap the prohibited area. In order to form dummy convex regions adjacent to the prohibited area while preventing the dummy convex regions from overlapping the prohibited area, the location of the dummy convex regions needs to be controlled. Such a control is technically difficult because it may cause a substantial increase in the amount of data for generating masks. On the other hand, when dummy convex regions cannot be formed adjacent to the prohibited area, the density of the dummy convex regions formed in the trench isolation region in an area adjacent to the prohibited area becomes insufficient.

However, in accordance with the embodiments of the present invention, as shown in FIG. 4(b), the dummy convex regions 32 are disposed on the first virtual linear lines L1 that extend in a direction traversing the row direction. In other words, adjacent ones of the dummy convex regions 32 disposed on the same one of the first virtual linear lines L1 are mutually off set in the column direction. As a result, even when one of the dummy convex regions 32 disposed on one of the first virtual linear lines L1 overlaps the prohibited area, the next one of the dummy convex regions 32 on the same first virtual linear line L1 can be disposed without overlapping the prohibited area.

Also, in accordance with the embodiments of the present invention, the dummy convex regions 32 are disposed on the second virtual linear lines L2 that extend in a direction traversing the column direction. In other words, adjacent ones of the dummy convex regions 32 disposed on the same one of the second virtual linear lines L2 are mutually off set in the row direction. As a result, even when one of the dummy convex regions 32 disposed on one of the second virtual linear lines L2 overlaps the prohibited area, the next one of the dummy convex regions 32 on the same second virtual linear line L2 can be disposed without overlapping the prohibited area. Accordingly, the dummy convex regions 32 can be securely formed adjacent to the prohibited area that extends in the column direction.

(2) In accordance with the embodiments of the present invention, dummy convex regions that may partially overlap a prohibited area are entirely eliminated. As a result, the following effects are obtained.

If dummy convex regions partially overlap a prohibited area, portions (hatched areas shown in FIG. 4(b)) of the dummy convex regions do not overlap the prohibited area. Those patched portions are hereafter referred to as "hangover dummy convex regions". The hangover dummy convex region has a shape in plan view that lacks a portion of the plan shape of the original dummy convex region. In other words, the hangover dummy convex region has a smaller plan area compared to a plan area of the original dummy convex region. When the hangover dummy convex region is extremely small in plan area (for example, when it is smaller than the resolution limit or the design rule), the following problems may occur.

(a) A resist layer to define the hangover dummy convex regions is difficult to form, and pattern skipping for the hangover dummy convex regions occurs. (b) Even if a resist layer to define the hangover dummy convex regions is formed, the resist layer may fall down, and the fallen resist layer becomes dust in an etching step to from a trench. Therefore the fallen resist deteriorates the etching step. (c) When an etching is conducted to form dummy convex regions, convex portions of the hangover dummy convex regions become very narrow, and therefore may break in a washing step to wash the substrate. The broken convex portions become foreign particles that may remain over the surface of the substrate. (d) If the surface foreign particles enter a dielectric layer, scratches may occur in the dielectric layer when the dielectric layer is polished.

In accordance with the embodiments of the present invention, any hangover dummy convex regions are not formed. As a result, the occurrence of the problems described above is securely prevented.

Figure 5:
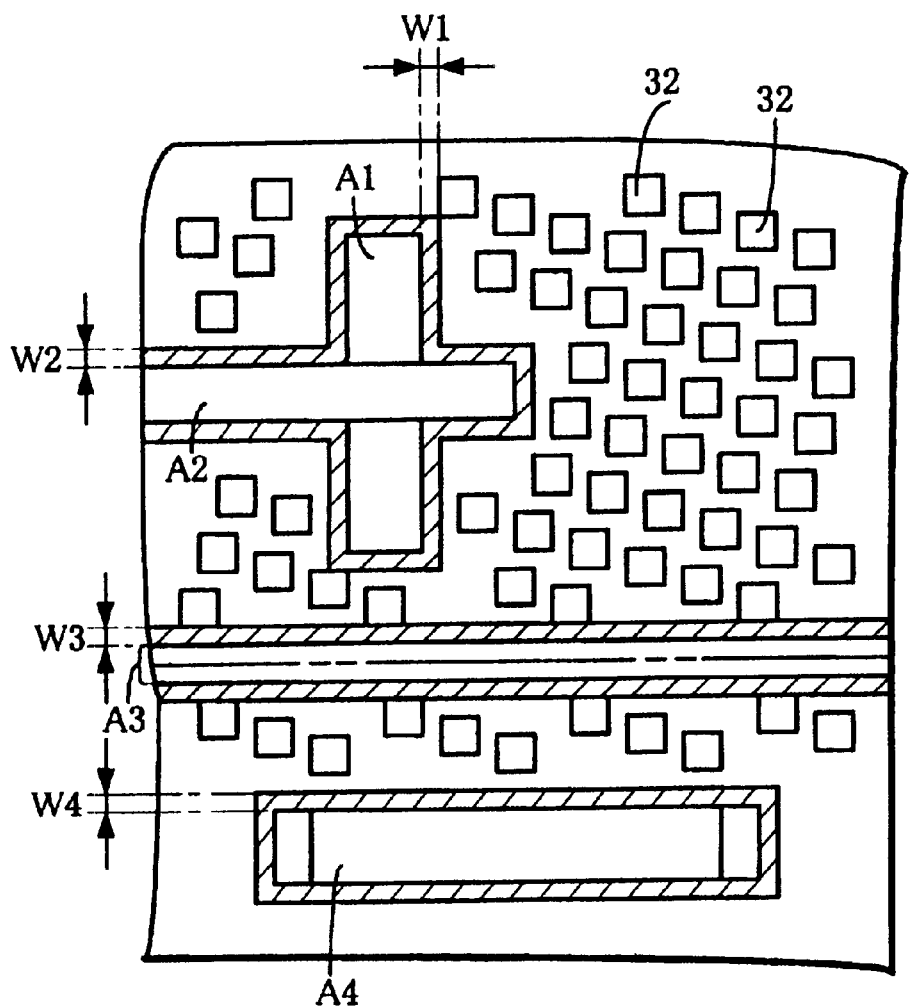
FIG. 5 schematically shows a plan view of a silicon substrate having dummy convex regions and prohibited areas.

Next, prohibited areas will be described. FIG. 5 shows a plan view of a silicon substrate having dummy convex regions. FIG. 5 shows prohibited areas in hatching. For example, the prohibited areas are provided in the following regions.

(1) A prohibited area is provided around an actual active region A1. If the prohibited area is not provided around the actual active region A1, dummy convex regions 32 may be formed in contact with the actual active region A1. In this case, the actual active region A1 and the dummy convex regions 32 are short-circuited, and a problem occurs in that unnecessary areas may become active regions. The width W1 of the prohibited area may not be limited to a particular range as long as the prohibited area can prevent the problem. For example, the width W1 may be about 0.5–20 μm, and more preferably about 1–5 μm. The dummy convex regions 32 may preferably be formed as close to the actual active region A1 as possible without overlapping the prohibited area.

(2) Secondly, a prohibited area is formed around a region A2 where a gate region is formed. If a prohibited area is not formed around the region A2, dummy convex regions 32 may be formed in a manner that the dummy convex regions 32 overlap the gate region. In this case, an active region may be formed below the gate region in an area that is not required. If such an active region is formed, a capacitance coupling is formed between the gate and the active region. As a result, problems occur in that, for example, the originally designed transistor characteristic is deteriorated. The width W2 of the prohibited area may not be limited to a particular range as long as the prohibited area can prevent the problem. For example, the width W2 may be about 0.5–20 μm, and more preferably about 1–5 μm.

(3) Thirdly, a prohibited area is formed around a boundary region A3 between an n-well and a p-well. If a prohibited area is not formed around the boundary region A3, dummy convex regions 32 may be formed in the boundary region A3 between the n-well and the p-well. In this case, the n-well and the p-well may contact each other through the dummy convex regions 32. As a result, problems occur in that, for example, current leaks occur. The width W3 of the prohibited area may not be limited to a particular range as long as the prohibited area can prevent the problems. For example, the width W3 may be about 0.5–20 μm, and more preferably about 1–5 μm. The dummy convex regions 32 may preferably be formed as close to the boundary region A3 between n-well and the p-well as possible without overlapping the prohibited area.

(4) Fourth, a prohibited area is formed around a well region A4 that functions as a resistor. If a prohibited area is not formed around the well region A4, dummy convex regions 32 may be formed over the well region A4. As a result, problems occur in that, for example, the resistance of the well region A4 changes. The width W4 of the prohibited area may not be limited to a particular range as long as the prohibited area can prevent the problems. For example, the width W4 may be about 0.5–20 μm, and more preferably about 1–5 μm. The dummy convex regions 32 may preferably be formed as close to the well region A4 as possible without overlapping the prohibited area.

[Method for Manufacturing Semiconductor Devices]

(Manufacturing Process)

Figure 6:
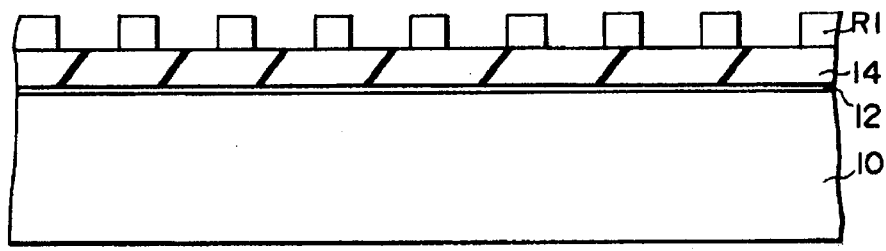
FIGS. 6(a)–6(c) schematically show cross-sectional views of a semiconductor device in steps of a manufacturing method in accordance with one embodiment of the present invention.
Figure 6:
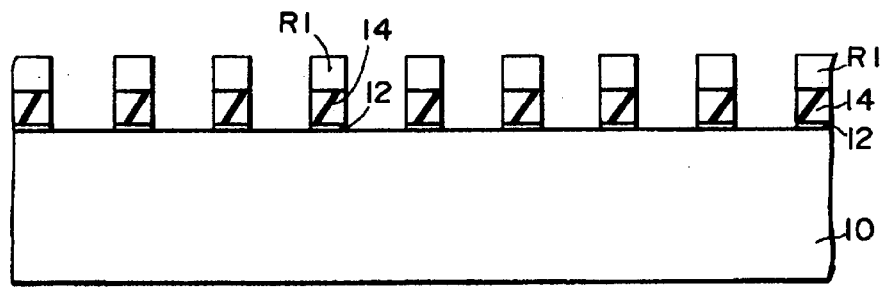
Figure 6:
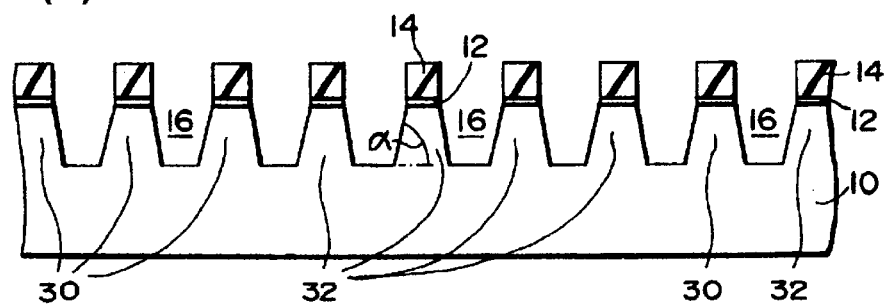
Figure 7:
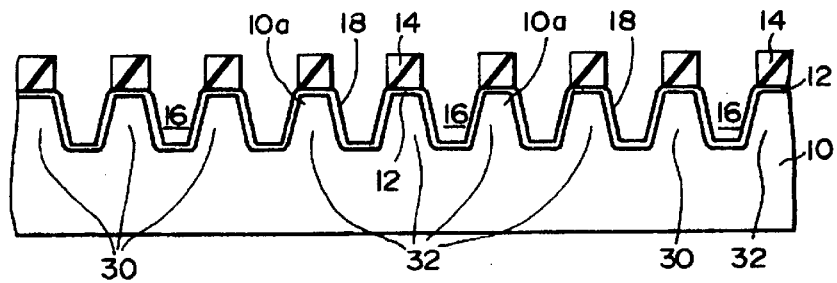
FIGS. 7(a)–7(c) schematically show cross-sectional views of the semiconductor device in steps of the manufacturing method in accordance with the embodiment of the present invention.
Figure 7:
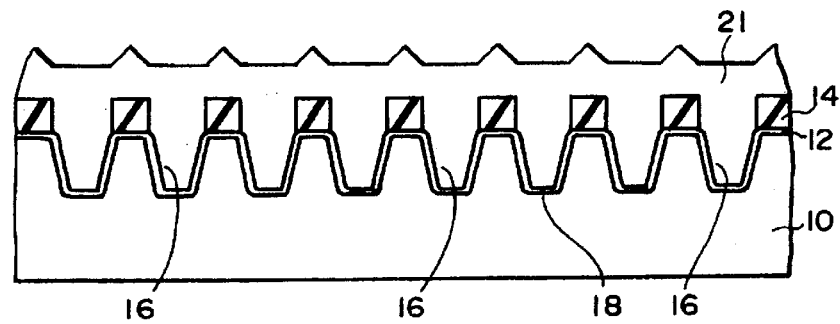
Figure 7:
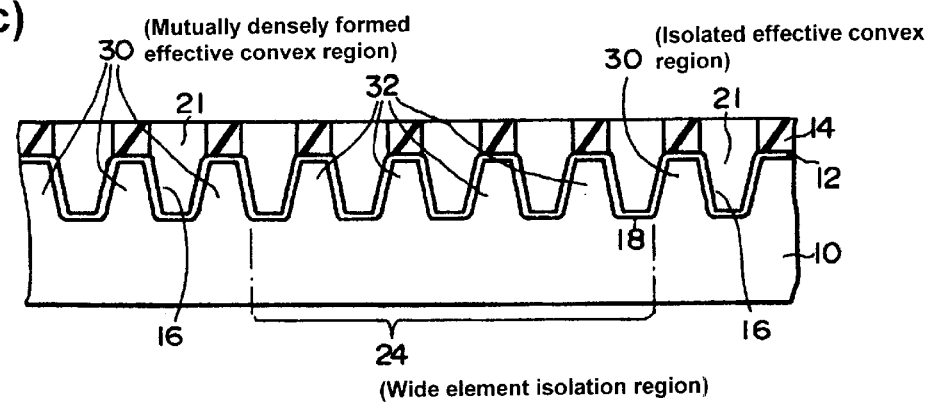
Figure 8:
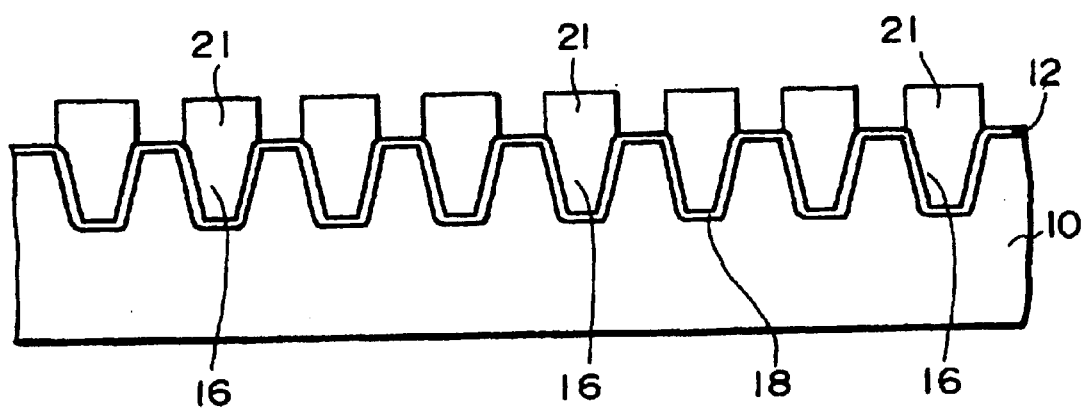
FIG. 8 schematically shows a cross-sectional view of a semiconductor device in a step of a manufacturing method in accordance with an embodiment of the present invention.

Next, a method for manufacturing a semiconductor device in accordance with an embodiment of the present invention will be described. In one embodiment a method for forming a trench isolation region will be described. FIGS. 6–8 schematically show cross sections of a semiconductor device in manufacturing process steps.

(1) Referring to FIG. 6($a$), a pad layer 12 is formed over a silicon substrate 10. The pad layer 12 may be formed from, for example, a silicon oxide, a silicon oxide nitride, and the like. When the pad layer 12 is formed from a silicon oxide, the pad layer 12 may be formed by a thermal oxidation method or a CVD method. When the pad layer 12 is formed from a silicon oxide nitride, the pad layer 12 may be formed by a CVD method. The thickness of the pad layer 12 is, for example, 2–20 nm.

Next, a polishing stopper layer 14 is formed over the pad layer 12. The polishing stopper layer 14 may have a single-layer structure or a multiple-layer structure. As a single-layer structure, any one of a silicon nitride layer, a polycrystal silicon layer and an amorphous silicon layer can be used. A multiple-layer structure may be formed from at least two layers selected from a silicon nitride layer, a polysilicon layer and an amorphous silicon layer. The polishing stopper layer 14 can be formed by a known method such as a CVD method. The polishing stopper layer 14 has a thickness that sufficiently functions as a stopper layer in a CMP step to be performed later, for example, a thickness of about 50–250 nm.

Next, a resist layer R1 having a specified pattern is formed over the polishing stopper layer 14. In one embodiment, the resist layer R1 is patterned to form convex regions 30 and 32 described above in conjunction with the device structure (see FIG. 1). In a preferred embodiment, the resist R1 is patterned such that the resist layer R1 over the effective convex regions 30 and the dummy convex regions 32 remain.

(2) Next, as shown in FIG. 6($b$), the polishing stopper layer 14 and the pad layer 12 are etched using the resist layer R1 as a mask. Preferably, the layers 14 and 12 may be etched by a dry etching, for example.

(3) Then, the resist layer R1 is removed. For example, the resist layer R1 may be removed by an ashing method. Then, as shown in FIG. 6 (c), the silicon substrate 10 is etched using the polishing stopper layer 14 as a mask to thereby form trenches 16. As the trenches 16 are formed, the effective convex regions 30 and the dummy convex regions 32 are formed.

The depth of the trenches 16 may differ depending on device designs. For example, the depth of the trenches 16 is about 300–500 nm. The silicon substrate 10 can be etched by a dry etching method. Each of the convex regions 30 and 32 may preferably have a tapered cross section. The convex regions 30 and 32 with a tapered cross section facilitate embedding of a dielectric layer 21 in the trenches 16. Reasons for this will be described below. The cross-sectional shape of each of the convex regions 30 and 32 has a taper angle α, which is preferably about 70 degree or greater but less than 90 degree.

Next, although not shown in the figures, end portions of the pad layer 12 between the silicon substrate 10 and the polishing stopper layer 14 are etched.

(4) Next, as shown in FIG. 7($a$), an exposed surface of the silicon substrate 10 in the trenches 16 is oxidized by a thermal oxidation method to thereby form a trench oxidation film 18. Since the end portions of the pad layer 12 are etched, shoulder sections 10a of the convex regions 30 and 32 are oxidized and rounded by the thermal oxidation. For example, the trench oxide layer 18 may have a film thickness of about 10–70 nm, and more preferably about 10–50 nm.

(5) Next, as shown in FIG. 7(b), a dielectric layer 21 is deposited over the entire surface of the silicon substrate in a manner to embed the trenches 16 with the dielectric layer 21. The dielectric layer 21 may be formed from, for example, silicon oxide. The thickness of the dielectric layer 21 is not limited to a particular range as long as the dielectric layer 21 has a sufficient thickness to embed the trenches 16 and cover at least the polishing stopper layer 14. For example, the dielectric layer 21 may have a film thickness of 500–800 nm. The dielectric layer 21 may be deposited by, for example, a high density plasma CVD (HDP-CVD) method, a thermal CVD method, a TEOS plasma CVD method or the like.

(6) Next, as shown in FIG. 7(c), the dielectric layer 21 is planarized by a CMP method. The planarization is conducted until the polishing stopper layer 14 is exposed. In other words, the dielectric layer 21 is planarized using the polishing stopper layer 14 as a stopper. In the present embodiment, the dummy convex regions 32 are formed in the relatively wide element isolation region 24. In other words, the dummy convex regions 32 are formed between an area where the effective convex regions 32 are densely formed and the isolated effective convex region 24. The dummy convex regions 32 are disposed in a pattern that is described above in conjunction with the device structure of the semiconductor device. As a result, the dummy convex regions 32 are securely formed adjacent to prohibited areas in the wide element isolation region 24. When polishing is conducted, the polishing pressure is more evenly distributed over the dummy convex regions 32 since the dummy convex regions 32 are more securely formed in the wide element isolation region 24. As a result, the polishing pressure is better prevented from concentrating over the isolated effective convex region 30. Consequently, the polishing stopper layer 14 over the isolated effective convex region 30 is better prevented from excessively being cut.

(7) Next, as shown in FIG. 8, the polishing stopper layer 14 is removed using, for example, a heated phosphoric acid solution. Then, as shown in FIG. 2, the pad layer 12 and upper portions of the dielectric layer 21 are isotropically etched by hydrofluoric acid. In this manner, the trench dielectric layers 20 are formed in the trenches 16, and the trench isolation regions 24 are completed.

Effects of the method for manufacturing semiconductor devices in accordance with the embodiment of the present invention are described below.

By the method described above, the dummy convex regions 32 are formed with the same pattern of the dummy convex regions 32 described above in conjunction with the structure of the semiconductor device. Accordingly, the dummy convex regions 32 are securely formed adjacent to the prohibited areas. As a result, as described above in conjunction with the step (6), the polishing stopper layer 14 at the isolated effective convex region 30 is better prevented from being excessively cut. Therefore, the trench dielectric layers 20 can have a more uniform film thickness.

[Experiments for Comparison]

Experiments are conducted to show how patterns of dummy convex regions change the formation of the dummy convex regions between effective convex regions. The experiments are conducted under the following conditions.

(1) In accordance with one embodiment of the present invention, a pattern of dummy convex regions is made according to the following rules:

(a) An angle between the first virtual linear lines and the row line is about 18.4 degree.

(b) A gap between the adjacent first virtual linear lines is about 3.2 μm.

(c) An angle between the second virtual linear lines and the column line is about 18.4 degree.

(d) A gap between the adjacent second virtual linear lines is about 3.2 μm.

(e) A ratio of an area of the dummy convex regions occupied in a unit area of an element isolation region is 40%.

(f) A shape of each of the dummy convex regions in plan view is square.

(g) Each edge of each of the dummy convex regions in plan view has a length of 2 μm.

(h) A gap between opposing edges of adjacent ones of the dummy convex regions disposed on the same one of the first virtual linear lines is 1 μm.

(i) A gap between opposing edges of adjacent ones of the dummy convex regions disposed on the same one of the second virtual linear lines is 1 μm.

(j) An off set width in the column direction between opposing edges of adjacent ones of the dummy convex regions disposed on the same one of the first virtual linear lines is 1 μm.

(k) An off set width in the row direction between opposing edges of adjacent ones of the dummy convex regions disposed on the same one of the second virtual linear lines is 1 μm.

(l) The dummy convex regions are formed such that their centers are located on the first virtual linear lines.

(m) The dummy convex regions are formed such that their centers are located on the second virtual linear lines.

(n) Any dummy convex regions that may entirely or partially overlap a prohibited area (including dummy convex regions adjacent to the prohibited area) are excluded.

(2) The prohibited areas are set in an area around the effective convex regions. The width of the prohibited area is 1 μm.

(3) A region A1 and a region B1 are set. In the region A1, a gap between adjacent ones of the effective convex regions is 10 μm. In the region B1, a gap between adjacent ones of the effective convex regions is 6 μm.

A comparison sample is formed under the following conditions.

(1) In a comparison example, dummy convex regions are disposed in the form of a lattice. More specifically, the dummy convex regions are formed according to the following rule.

(a) A gap between adjacent ones of the dummy convex in the row direction is 1 μm.

(b) A gap between adjacent ones of the dummy convex in the column direction is 1 μm.

(c) A shape of each of the dummy convex regions in plan view is square.

(d) Each edge of each of the dummy convex regions in plan view has a length of 2 μm.

(e) Any dummy convex regions that may entirely or partially overlap a prohibited area (including dummy convex regions adjacent to the prohibited area) are excluded.

(2) The prohibited areas are set in an area around the effective convex regions. The width of the prohibited area is 1 μm.

(3) A region A2 and a region B2, which correspond to the region A1 and the region B1, respectively, are set. In the region A2, a gap between adjacent ones of the effective convex regions is 10 μm. In the region B2, a gap between adjacent ones of the effective convex regions is 6 μm.

Figure 9:
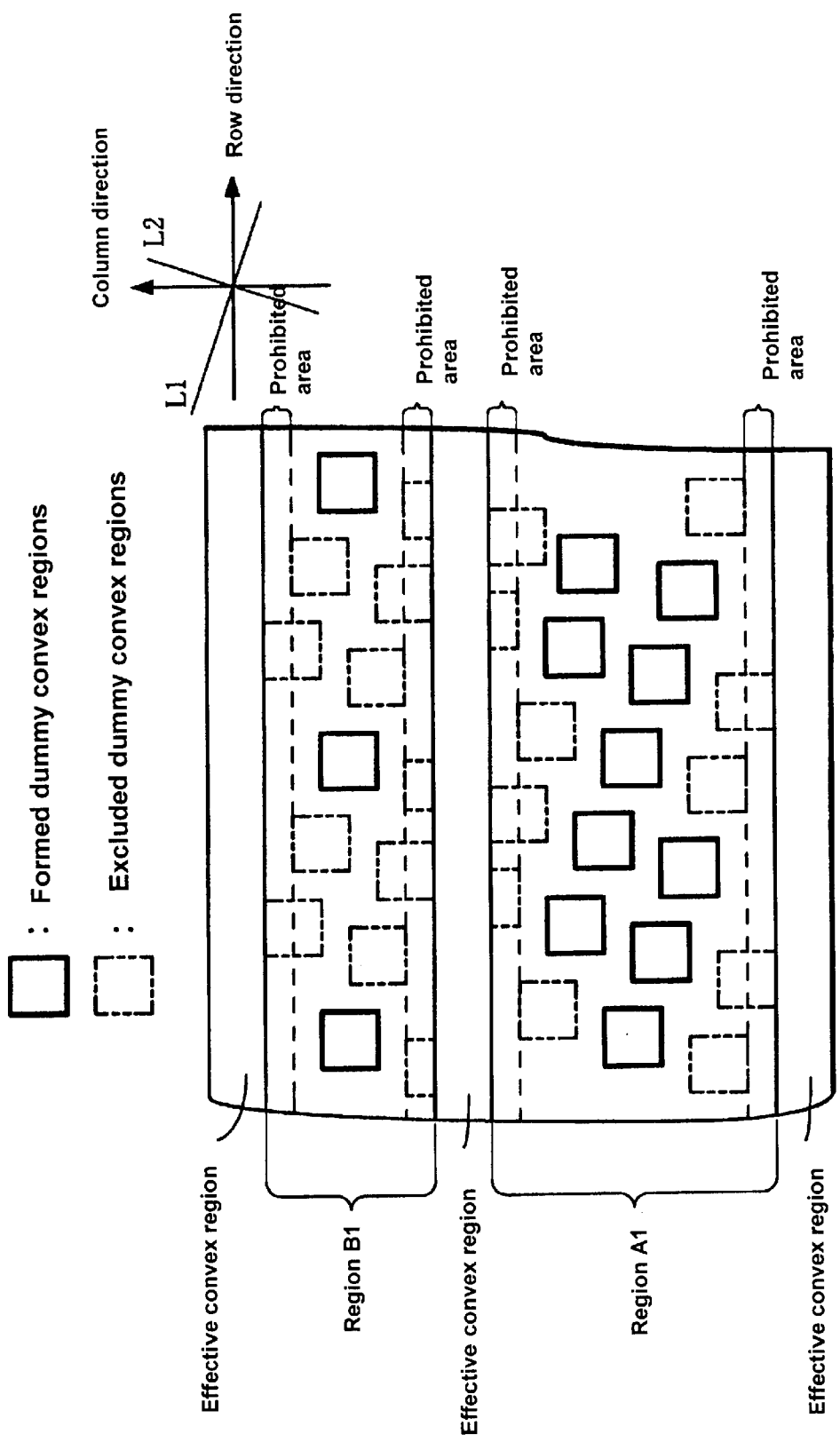
FIG. 9 shows a plan view of a part of a wafer in accordance with an embodiment of the present invention.
Figure 10:
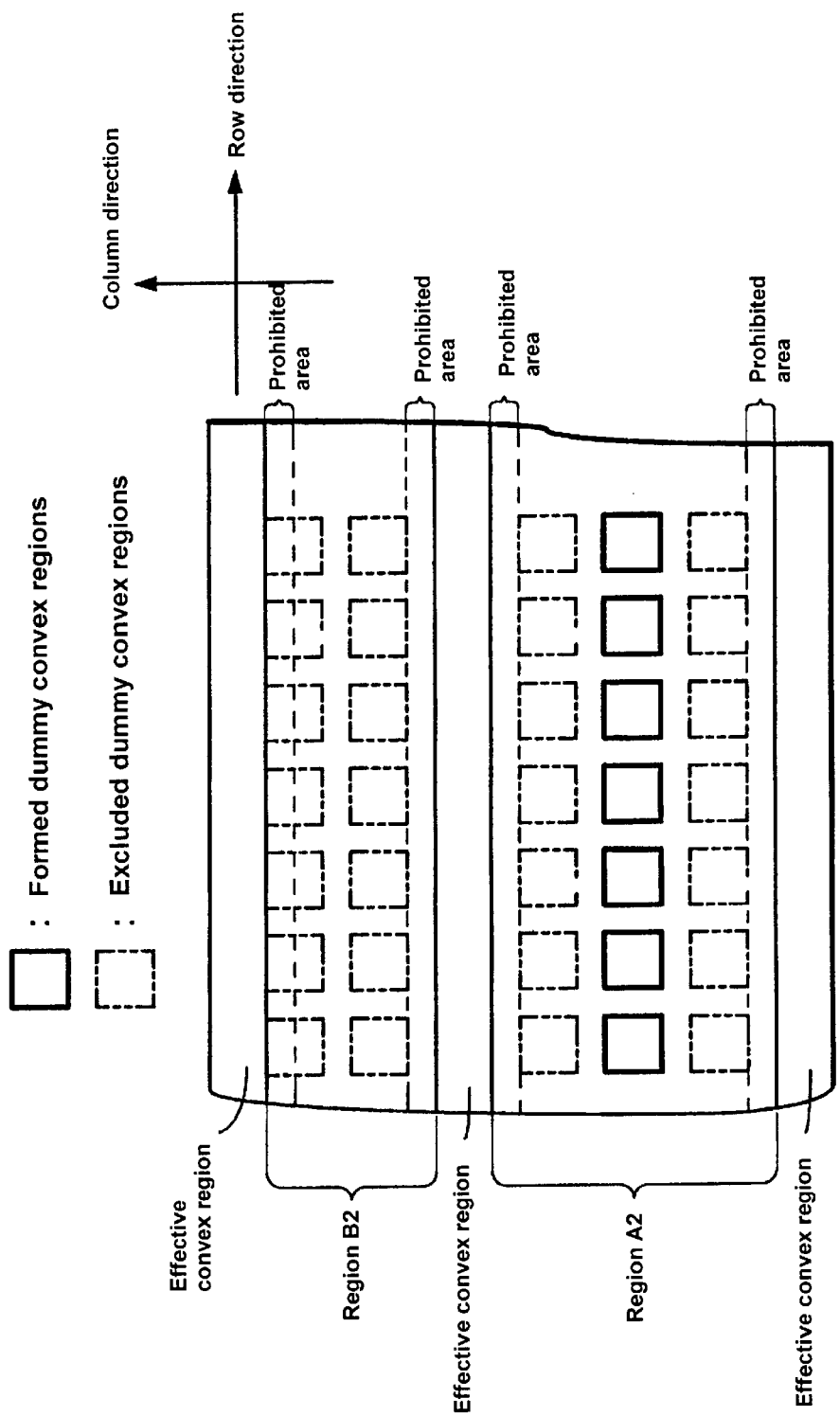
FIG. 10 shows a plan view of a part of a wafer for comparison.
Figure 12:
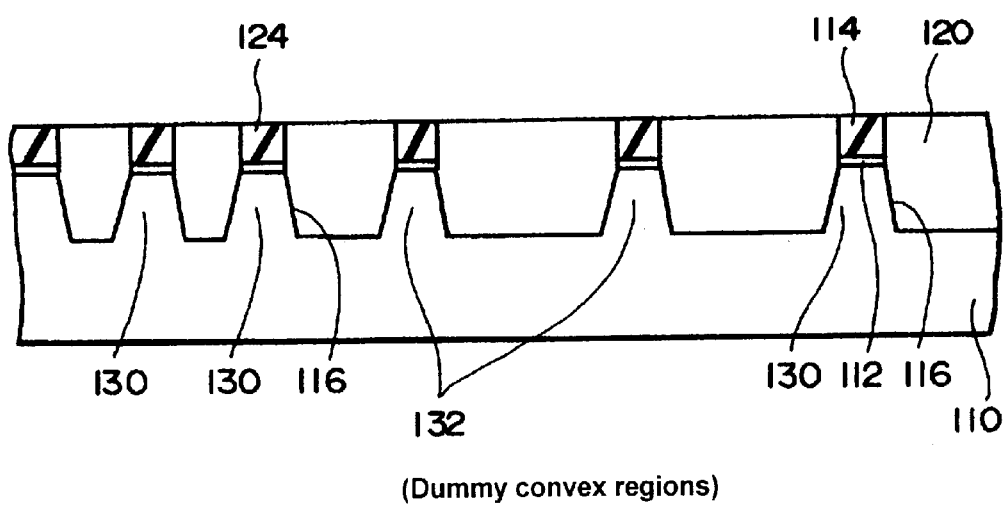
FIG. 12 schematically shows a cross-sectional view of a trench isolation region in which dummy convex regions are formed.

Comparison results are shown in FIGS. 9 and 10. FIG. 9 shows a plan view of a part of a wafer in accordance with the embodiment of the present invention. FIG. 10 shows a plan view of a part of a wafer for comparison. In the figures, squares shown by solid lines indicate dummy convex regions that are actually formed, and squares shown by broken lines indicate virtual dummy convex regions that are excluded.

In the comparison example shown in FIG. 10, the dummy convex regions are formed in only one line in the region A2. In other words, dummy convex regions are not formed adjacent to the prohibited areas. In contrast, as shown in FIG. 9, in accordance with the embodiment of the present invention, the dummy convex regions are securely formed in the region A1 in areas adjacent to the prohibited areas.

In the comparison example shown in FIG. 10, dummy convex regions are not formed in an area where the gap between the effective convex regions is narrow (the region B2). In contrast, as shown in FIG. 9, in accordance with the embodiment of the present invention, the dummy convex regions are formed in an area where the gap between the effective convex regions is narrow (the region B1).

It is understood from the above that the embodiment of the present invention more securely form dummy convex regions in an element isolation region compared to the comparison example.

[Modified Embodiments]

The present invention is not limited to the embodiments described above, and a variety of modifications can be made within the scope of the subject matter of the present invention.

In the embodiments described above, the dummy convex regions 32 are formed in a manner that their centers are disposed on the first virtual linear lines L1. However, the dummy convex regions 32 may be formed in a manner that portions other than their centers are disposed on the first virtual linear lines L1. In other words, it is acceptable if the dummy convex regions 32 may be disposed on the first virtual linear lines L1.

In the embodiments described above, the dummy convex regions 32 are formed in a manner that their centers are disposed on the second virtual linear lines L2. However, the dummy convex regions 32 may be formed in a manner that portions other than their centers are disposed on the second virtual linear lines L2. In other words, it is acceptable if the dummy convex regions 32 may be disposed on the second virtual linear lines L2.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A semiconductor device comprising:
   a trench isolation region defining a first matrix direction and at least one first virtual linear line extending in a direction that traverses the first matrix direction, wherein the first matrix direction and the first virtual linear line define an angle of 2 to 40 degrees; and
   a plurality of dummy convex regions in the trench isolation region, wherein the dummy convex regions are disposed on the at least one first virtual linear Pine;
   wherein each of the dummy convex regions has a generally square shape and all the square shapes in the trench isolation region are the same as each other in plan;
   wherein at least two adjacent ones of the dummy convex regions disposed on the first virtual linear line have edges that partially oppose one another; and
   wherein the edges of the at least two adjacent ones of the dummy convex regions are spaced a distance from one another, the distance being shorter than each of the edges of the at least two adjacent ones of the dummy convex regions.

2. A semiconductor device according to claim 1, wherein the at least one first virtual linear line includes a plurality of first virtual linear lines spaced a specified gap from one another.

3. A semiconductor device according to claim 2, wherein the specified gap is 1–16 μm.

4. A semiconductor device according to claim 1, wherein a center of each of the dummy convex regions is located on the at least one first virtual linear line.

5. A semiconductor device according to claim 1, wherein the trench isolation region further defines a second matrix direction perpendicular to the first matrix direction and at least one second virtual linear line extending in a direction that traverses the second matrix direction,
   wherein the second matrix direction and the at least one second virtual linear line define an angle of about 2 to 40 degrees, and wherein the dummy convex regions are disposed on the at least one second virtual linear line.

6. A semiconductor device according to claim 5, wherein the at least one second virtual linear line includes a plurality of second virtual linear lines spaced a specified gap from one another.

7. A semiconductor device according to claim 6, wherein the specified gap is 1–16 μm.

8. A semiconductor device according to claim 5, wherein a center of each of the dummy convex regions is located on the at least one second virtual linear line.

9. A semiconductor device according to claim 1, wherein a plan area of the dummy convex regions is about 30–50% of a plan area of the trench isolation region.

10. A semiconductor device according to claim 9, wherein the plan area of the dummy convex regions is 40% of the plan area of the trench isolation region.

11. A semiconductor device according to claim 1, wherein each of the dummy convex regions has a generally rectangular shape in plan.

12. A semiconductor device according to claim 11, wherein each of the dummy convex regions has a generally square shape in plan.

13. A semiconductor device according to claim 11, wherein at least two adjacent ones of the dummy convex regions disposed on the first virtual linear line have edges that partially oppose one another.

14. A semiconductor device according to claim 1, wherein the distance between the edges is about 0.5–5 μm.

15. A semiconductor device according to claim 14, wherein the distance between the edges is about 1 μm.

16. A semiconductor device according to claim 11, wherein each edge of each of the dummy convex regions has a length of 1 μm or greater.

17. A semiconductor device according to claim 16, wherein each edge of each of the dummy convex regions has a length of 10 µm or less.

18. A semiconductor device according to claim 17, wherein each edge of each of the dummy convex regions has a length of 5 µm or less.

19. A semiconductor device according to claim 18, wherein each edge of each of the dummy convex regions has a length of about 2 µm.

20. A semiconductor device comprising:
a trench isolation region defining a first matrix direction and at least one first virtual linear line extending in a direction that traverses the first matrix direction, wherein the first matrix direction and the first virtual linear line define an angle of 2 to 40 degrees; and
a plurality of dummy convex regions in the trench isolation region, wherein the dummy convex regions are disposed on the at least one first virtual linear line;
wherein the trench isolation region includes a prohibited area where the dummy convex regions are not formed, and all the dummy convex regions in the trench isolation region have the same shape as each other in plan.

21. A semiconductor device according to claim 20, wherein the prohibited area has a width of about 0.5–20 µm.

22. A semiconductor device according to claim 5, wherein each of the dummy convex regions has a generally rectangular shape in plan.

23. A semiconductor device comprising:
a trench isolation region defining a first matrix direction and at least one first virtual linear line extending in a direction that traverses the first matrix direction, wherein the first matrix direction and the first virtual linear line define an angle of 2 to 40 degrees; and
a plurality of dummy convex regions in the trench isolation region, wherein the dummy convex regions are disposed on the at least one first virtual linear line;
wherein the trench isolation region further defines a second matrix direction perpendicular to the first matrix direction and at least one second virtual linear line extending in a direction that traverses the second matrix direction,
wherein the second matrix direction and the at least one second virtual linear line define an angle of about 2 to 40 degrees, and wherein the dummy convex regions are disposed on the at least one second virtual linear line;
wherein each of the dummy convex regions has a generally square shape and all the square shapes of the dummy convex regions in the trench isolation region are the same as each other in plan.

24. A semiconductor device according to claim 22, wherein at least two adjacent ones of the dummy convex regions disposed on the second virtual linear line have edges that partially oppose one another.

25. A semiconductor device according to claim 24, wherein the edges of the at least two adjacent ones of the dummy convex regions are spaced a distance from one another, the distance being shorter than each of the edges of the at least two adjacent ones of the dummy convex regions.

26. A semiconductor device according to claim 25, wherein the distance between the edges is about 0.5–5 µm.

27. A semiconductor device according to claim 26, wherein the distance between the edges is about 1 µm.

28. A semiconductor device according to claim 22, wherein each edge of each of the dummy convex regions has a length of 1 µm or greater.

29. A semiconductor device according to claim 28, wherein each edge of each of the dummy convex regions has a length of 10 µm or less.

30. A semiconductor device according to claim 29, wherein each edge of each of the dummy convex regions has a length of 5 µm or less.

31. A semiconductor device according to claim 30, wherein each edge of each of the dummy convex regions has a length of about 2 µm.

32. A semiconductor device according to claim 5, wherein at least two adjacent ones of the dummy convex regions disposed on the first virtual linear line have edges that partially oppose one another, and at least two adjacent ones of the dummy convex regions disposed on the second virtual linear line have edges that partially oppose one another.

33. A semiconductor device according to claim 32, wherein each of the dummy convex regions has a generally rectangular shape in plan.

34. A semiconductor device comprising:
a trench isolation region defining a first matrix direction and at least one first virtual linear line extending in a direction that traverses the first matrix direction, wherein the first matrix direction and the first virtual linear line define an angle 0(2 to 40 degrees; and
a plurality of dummy convex regions in the trench isolation region, wherein the dummy convex regions are disposed on the at least one first virtual linear line;
wherein the trench isolation region further defines a second matrix direction perpendicular to the first matrix direction and at least one second virtual linear line extending in a direction that traverses the second matrix direction,
wherein the second matrix direction and the at least one second virtual linear line define an angle of about 2 to 40 degrees, and wherein the dummy convex regions are disposed on the at least one second virtual linear line;
wherein at least two adjacent ones of the dummy convex regions disposed on the first virtual linear line have edges that partially oppose one another, and at least two adjacent ones of the dummy convex regions disposed on the second virtual linear line have edges that partially oppose one another;
wherein each of the dummy convex regions has a generally rectangular shape and all the rectangular shapes of the dummy convex regions in the trench isolation region are the same as each other in plan;
wherein the edges of the at least two adjacent ones of the dummy convex regions disposed on the first virtual linear line are spaced a first distance from one another, the first distance being shorter than each of the edges of the at least two adjacent ones of the dummy convex regions disposed on the first virtual linear line, and the edges of the at least two adjacent ones of the dummy convex regions disposed on the second virtual linear line are spaced a second distance from one another, the second distance being shorter than each of the edges of the at least two adjacent ones of the dummy convex regions disposed on the second virtual linear line.

35. A semiconductor device according to claim 34, wherein each of the first distance and the second distance is about 0.5–5 µm.

36. A semiconductor device according to claim 35, wherein each of the first distance and the second distance is about 1 µm.

37. A semiconductor device according to claim 34, wherein each edge of each of the dummy convex regions has a length of 1 µm or greater.

38. A semiconductor device according to claim 37, wherein each edge of each of the dummy convex regions has a length of 10 µm or less.

39. A semiconductor device according to claim 38, wherein each edge of each of the dummy convex regions has a length of 5 µm or less.

40. A semiconductor device according to claim 39, wherein each edge of each of the dummy convex regions has a length of about 2 µm.

41. A semiconductor device comprising:

a trench isolation region defining a row direction and a column direction; and a plurality of dummy convex regions in the trench isolation region disposed in the row direction and the column direction, wherein each of the dummy convex regions has a generally square plan shape, and all the dummy convex regions in the trench isolation legion have the same shape as each other in plan, the dummy convex regions that are arranged next to one another in the row direction are spaced a first distance from one another, the first distance being about a half of an edge of each of the dummy convex regions, and the dummy convex regions that are arranged next to one another in the row direction are offset by a second distance from one another in the column direction, the second distance being about a half of an edge of each of the: dummy convex regions.

42. A semiconductor device according to claim 41, wherein the dummy convex regions that are arranged next to one another in the column direction are spaced a third distance from one another, the third distance being about a half of an edge of each of the dummy convex regions, and the dummy convex regions that are arranged next to one another in the column direction are offset by a fourth distance from one another in the row direction, the fourth distance being about a half of an edge of each of the dummy convex regions.

43. A semiconductor device comprising:

a trench isolation region defining a row direction and a column, direction; and a plurality of dummy convex regions in the trench isolation region disposed in the row direction and the column direction, wherein each of the dummy convex regions has a generally square plan shape, and all the dummy convex regions in the trench isolation region have the same shape as each other in plan, the dummy convex regions that are arranged next to one another in the column direction are spaced a first distance from one another, the first distance being about a half of an edge of each of the dummy convex regions, and the dummy convex regions that are arranged next to one another in the column direction are offset by a second distance from one another in the row direction, the second distance being about a half of an edge of each of the dummy convex regions.

44. A semiconductor device according to claim 41, wherein each edge of each of the dummy convex regions has a length of about 2 µm.

45. A semiconductor device comprising:

a substrate;

a plurality of effective convex regions formed on the substrate, the plurality of effective convex regions including a first subset of regions densely formed relative to one another, and a second subset of regions spaced apart from the first subset of regions by an isolation region;

a first prohibited area defined between the isolation region and the first subset of regions;

a second prohibited area defined between the isolation region and the second subset of regions; and a plurality of dummy convex regions formed in the isolation region in an array of parallel lines extending at an angle of 2 to 40 degrees relative to a boundary between said isolation region and said first prohibited area;

wherein the first and second prohibited areas are free of dummy convex regions, and all the dummy convex regions in the isolation region have the same shape as each other in plan.

* * * * *

UNITED STATES PATENT AND TRADEMARK OFFICE
CERTIFICATE OF CORRECTION

PATENT NO. : 6,605,852 B2
DATED : August 12, 2003
INVENTOR(S) : Mori et al.

It is certified that error appears in the above-identified patent and that said Letters Patent is hereby corrected as shown below:

Title page,
Item [57], ABSTRACT,
Line 7, "define" should be -- defines --

Column 5,
Line 40, "a" should be -- an --

Column 7,
Line 28, "word" should be -- words --

Column 9,
Lines 35 and 47, after "each" insert -- of --

Column 14,
Lines 52 and 54, after "convex" insert -- regions --

Column 16,
Line 5, "Pine" should be -- line --

Column 18,
Line 20, "0(2" should be -- of 2 --

Column 19,
Line 15, "legion" should be -- region --

Signed and Sealed this

First Day of June, 2004

JON W. DUDAS
*Acting Director of the United States Patent and Trademark Office*